(12) United States Patent
Snyder et al.

(10) Patent No.: US 8,889,028 B2
(45) Date of Patent: Nov. 18, 2014

(54) N-TYPE DOPED PBTE AND PBSE ALLOYS FOR THERMOELECTRIC APPLICATIONS

(75) Inventors: G. Jeffrey Snyder, Pasadena, CA (US); Aaron LaLonde, Pasadena, CA (US); Yanzhong Pei, Pasadena, CA (US); Heng Wang, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 132 days.

(21) Appl. No.: 13/463,726

(22) Filed: May 3, 2012

(65) Prior Publication Data

US 2014/0027681 A1    Jan. 30, 2014

Related U.S. Application Data

(60) Provisional application No. 61/482,081, filed on May 3, 2011.

(51) Int. Cl.
   *H01L 35/16*    (2006.01)
   *H01L 35/34*    (2006.01)
   *C01B 19/00*    (2006.01)

(52) U.S. Cl.
   CPC ............... *H01L 35/16* (2013.01); *H01L 35/34* (2013.01); *C01B 19/007* (2013.01); *C01P 2002/54* (2013.01); *C01P 2006/40* (2013.01)
   USPC ..................................... 252/62.3 T

(58) Field of Classification Search
   CPC .............................. H01L 35/16; H01L 35/34
   USPC ....................... 136/238; 252/62.3 T
   See application file for complete search history.

(56) References Cited

U.S. PATENT DOCUMENTS 2,811,720 A * 10/1957 Fritts et al. .................... 420/563
3,197,342 A *  7/1965 Neild, Jr. ....................... 136/210
2008/0289677 A1* 11/2008 Bell et al. ................... 136/236.1

OTHER PUBLICATIONS

Ugai et al, "Effect of Iodine Content on the Lattice Parameter of PbTe1-xIx Solid solutions", Inorganic Matrials, vol. 40, No. 8, 2004, pp. 925-927.*
Sharov et al, "Microhardness and Density of PbTe1-xHalx (Hal=Cl, Br, I) Solid Solutions", Inorganic Materials, vol. 42, No. 7, 2006, pp. 723-725.*
Yoneda et al, "Anomalous thermal expansion of Pb—Te system semiconductors", Journ. Appl. Phys., 107, Apr. 2010, 074901-1 to 074901-6.*

* cited by examiner

*Primary Examiner* — Carol M Koslow
(74) *Attorney, Agent, or Firm* — Brian T. Duke; Nixon Peabody LLP

(57) ABSTRACT

The present invention demonstrates that weak scattering of carriers leads to a high mobility and therefore helps achieve low electric resistivity with high Seebeck coefficient for a thermoelectric material. The inventors demonstrate this effect by obtaining a thermoelectric figure of merit, zT, higher than 1.3 at high temperatures in n-type PbSe, because of the weak scattering of carriers in the conduction band as compared with that in the valence band. The invention further demonstrates favorable thermoelectric transport properties of n-type $PbTe_{1-x}I_x$ with carrier concentrations ranging from $5.8 \times 10^{18}$-$1.4 \times 10^{20}$ cm$^{-3}$.

4 Claims, 15 Drawing Sheets

N-TYPE DOPED PBTE AND PBSE ALLOYS FOR THERMOELECTRIC APPLICATIONS

CROSS-REFERENCE TO RELATED APPLICATIONS

This application claims priority from U.S. Provisional Patent Application No. 61/482,081, filed on May 3, 2011, which is incorporated herein by reference in its entirety.

STATEMENT REGARDING FEDERALLY-SPONSORED RESEARCH

This invention was made with government support under Grant No. W911NF-08-C-0059 awarded by the US Army Research Office. The government has certain rights in the invention.

The invention described herein was also made in the performance of work under a NASA contract, and is subject to the provisions of Public Law 96-517 (35 USC 202) in which the Contractor has elected to retain title.

FIELD OF INVENTION

The present invention relates to the use of advanced thermoelectrics for power generation.

BACKGROUND

Recovering part of the energy that was let go in form of waste heat via a thermoelectric power generator is drawing more and more interests from the automobile industry as well as many other areas. Mass production of bulk materials with high figure of merit zT, defined as $zT = S^2 T/\rho\kappa$ (S is the Seebeck coefficient, $\rho$ is the electric resistivity and $\kappa$ is the thermal conductivity), is the key to promoting wide application of such thermoelectric devices. During the past decades materials scientists have been searching for good thermoelectric candidates among semiconductors that have adequate band gaps as well as low thermal conductivities. However, there is still a need in the art for improved thermoelectric materials.

SUMMARY OF THE INVENTION

In some embodiments, the invention teaches a thermoelectric material of the formula $Pb_{1.002}Se_{1-x}Br_x$. In certain embodiments, $0.04 \leq x \leq 0.4$. In some embodiments, the thermoelectric figure of merit (zT) is greater than 1.2 at 850K. In some embodiments, the doping level is $3 \times 10^{19}$ $Cm^{-3}$. In certain embodiments, $1.8 \times 10^{19}$ $Cm^{-3} \leq n_H \leq 4.5 \times 10^{19}$ $Cm^{-3}$ at about 300K.

In certain embodiments, the invention teaches a method of manufacturing a thermoelectric material, including: providing a quantity of elements, comprising Pb, Se, and $PbBr_2$; loading the elements into containers; and heating, quenching, annealing, crushing and hot pressing the quantity of elements. In some embodiments, the thermoelectric material is of a formula $Pb_{1.002}Se_{1-x}Br_x$. In some embodiments, $0.04 \leq x \leq 0.4$. In certain embodiments, the thermoelectric material has a thermoelectric figure of merit (zT)$\geq 1.2$ at 850K. In certain embodiments, the thermoelectric material has a doping level of $3 \times 10^{19}$ $Cm^{-3}$. In some embodiments, $1.8 \times 10^{19}$ $Cm^{-3} \leq n_H \leq 4.5 \times 10^{19}$ $Cm^{-3}$ at about 300K.

In certain embodiments, the invention teaches a thermoelectric material of the formula $PbTe_{1-x}I_x$. In certain embodiments, $0.0004 \leq x \leq 0.01$. In some embodiments, the thermoelectric figure of merit (zT) is 1.4 at 700K-800K. In certain embodiments, the doping level is $5.8 \times 10^{18}$-$1.4 \times 10^{20}$ $Cm^{-3}$.

In certain embodiments, the invention teaches a method of manufacturing a thermoelectric material, including: providing a quantity of elements, comprising Pb, Te, and $PbI_2$; loading the elements into containers; melting and quenching the elements to produce end compounds; and mixing the end compounds having the stoichiometry PbTe and $PbTe_{0.99}I_{0.01}$ to produce a thermoelectric material of the formula $PbTe_{1-x}I_x$. In certain embodiments, $0.0004 \leq x \leq 0.01$. In some embodiments the thermoelectric material has a thermoelectric figure of merit (zT) of 1.4 at 700K-800K. In some embodiments, the thermoelectric material has a doping level of $5.8 \times 10^{18}$-$1.4 \times 10^{20}$ $Cm^{-3}$.

2063; Efimova et al. *Sov. Phys. Semi-cond.*, 1971, 4, 1653-1658; and Alekseeva et al, *Semiconductors*, 1996, 30, 1125-1127).

Figure 10:
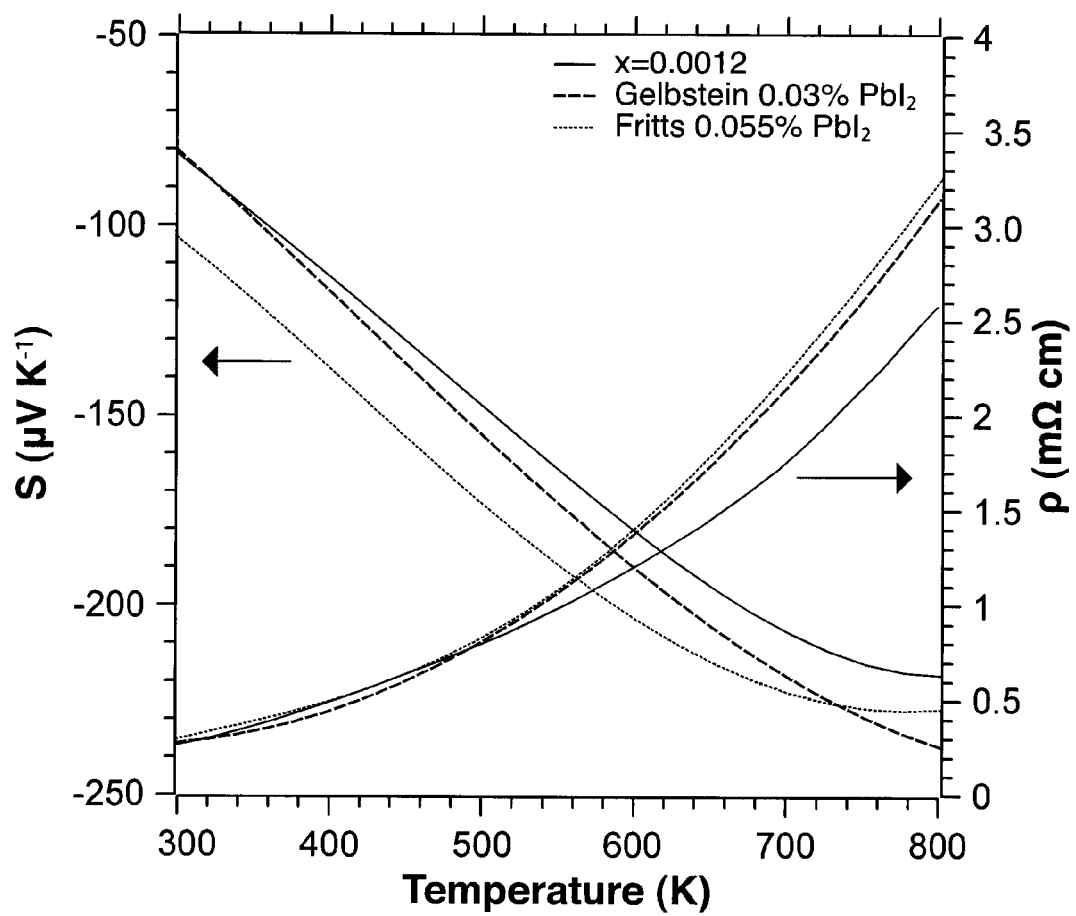

FIG. 10 demonstrates, in accordance with an embodiment of the invention, comparison of Seebeck and resistivity values for samples of similar composition from the present work and literature (R. Fritts, *Thermoelectric Materials and Devices*, 1960, pp. 143-162; and Gelbstein et al, *Proc. 21st Int. Conf. Thermoelectrics*, 2002, 9-12).

Figure 11:
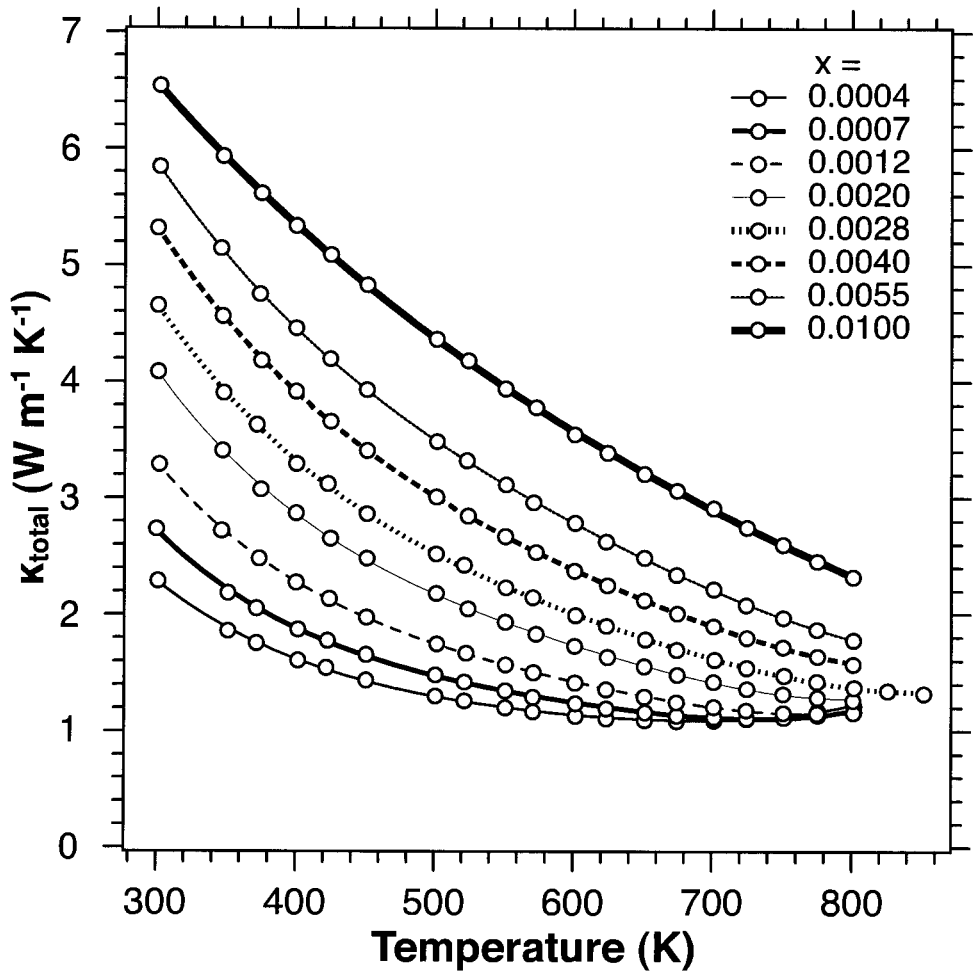

FIG. 11 demonstrates, in accordance with an embodiment of the invention, total thermal conductivity as a function of temperature for $PbTe_{1-x}I_x$.

Figure 12:
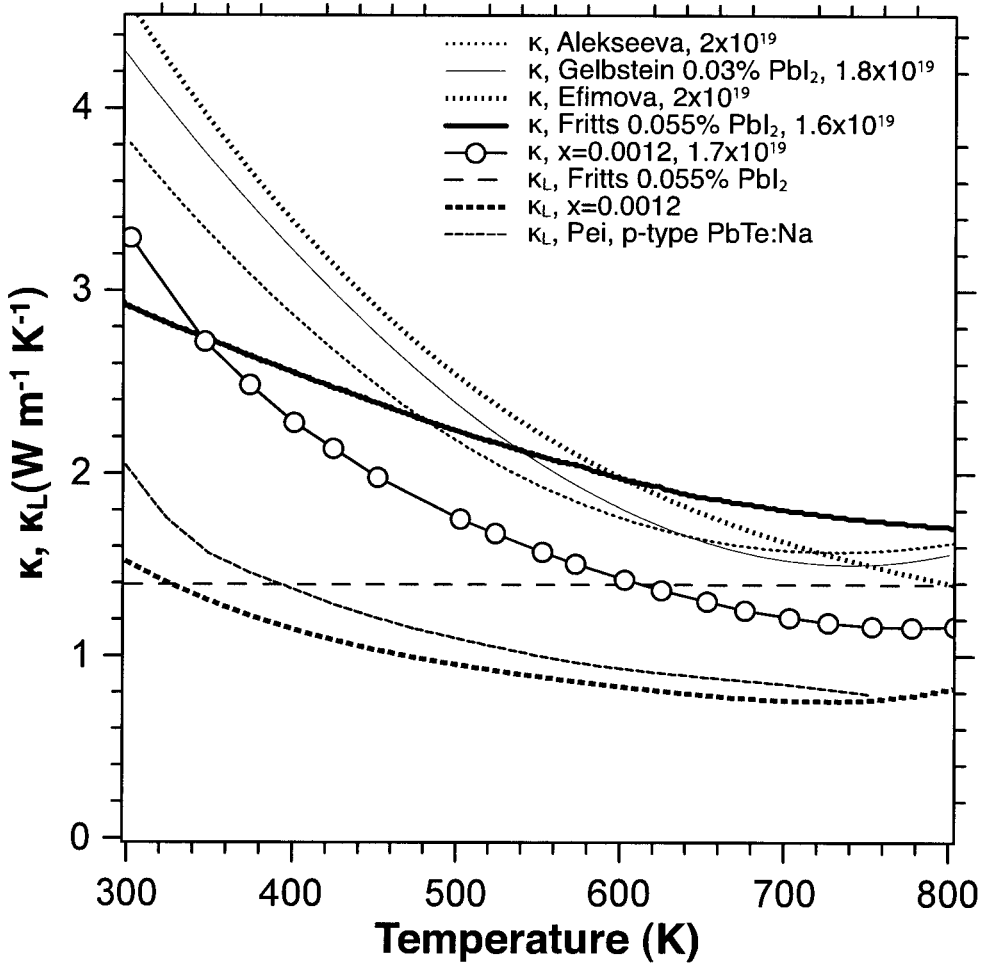

FIG. 12 demonstrates, in accordance with an embodiment of the invention, comparison of total thermal conductivity from literature and the present study (R. Fritts, *Thermoelectric Materials and Devices*, 1960, pp. 143-162; Gelbstein et al, *Proc. 21st Int. Conf. Thermoelectrics*, 2002, 9-12; Efimova et al. *Sov. Phys. Semi-cond.*, 1971, 4, 1653-1658; and Alekseeva et al, *Semiconductors*, 1996, 30, 1125-1127). Also shown are the lattice component of thermal conductivity assumed by Fritts, the values from this study for the sample x=0.0012, and the values from recently reported PbTe:Na p-type material (Pei et al, *Energy Environ. Sci.*, 2011, DOI: 10.1039/c0ee00456a). Data from similar carrier concentration values is shown.

Figure 13:
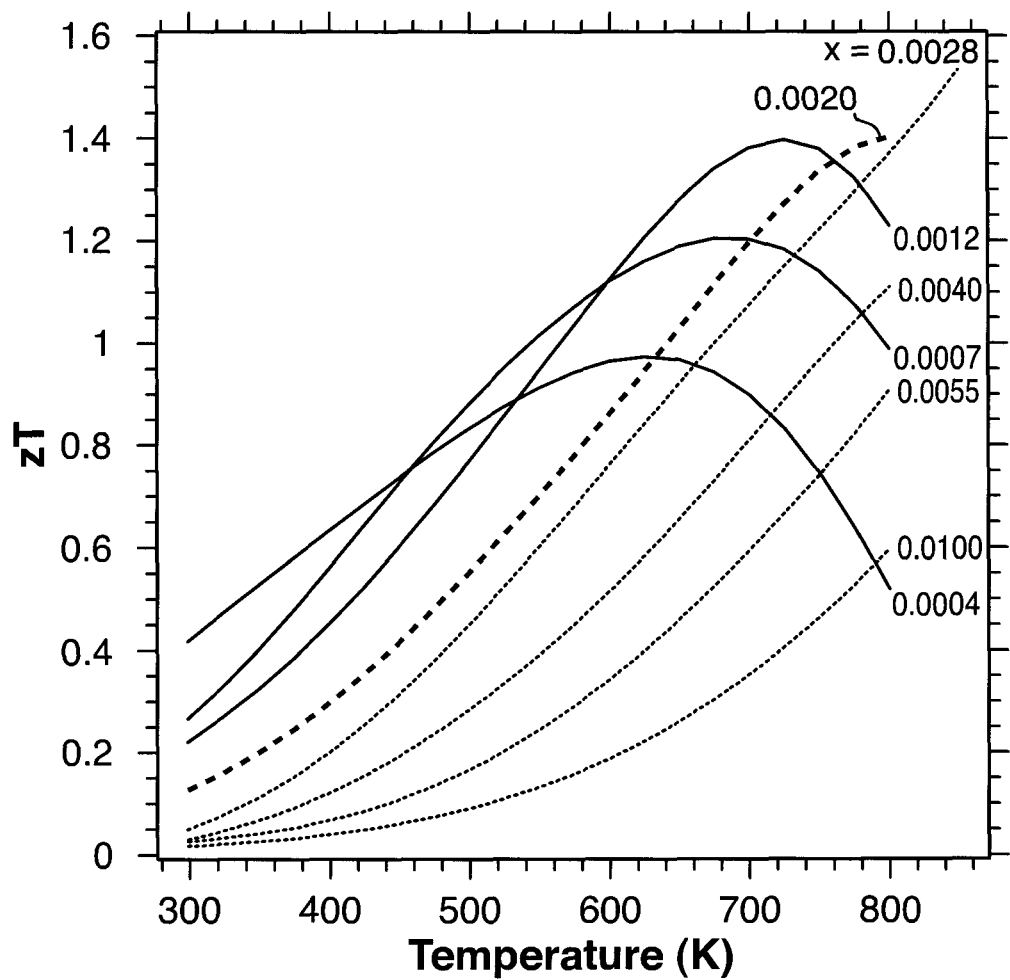

FIG. 13 demonstrates, in accordance with an embodiment of the invention, figure of merit, zT, as a function of temperature for $PbTe_{1-x}I_x$.

Figure 14:
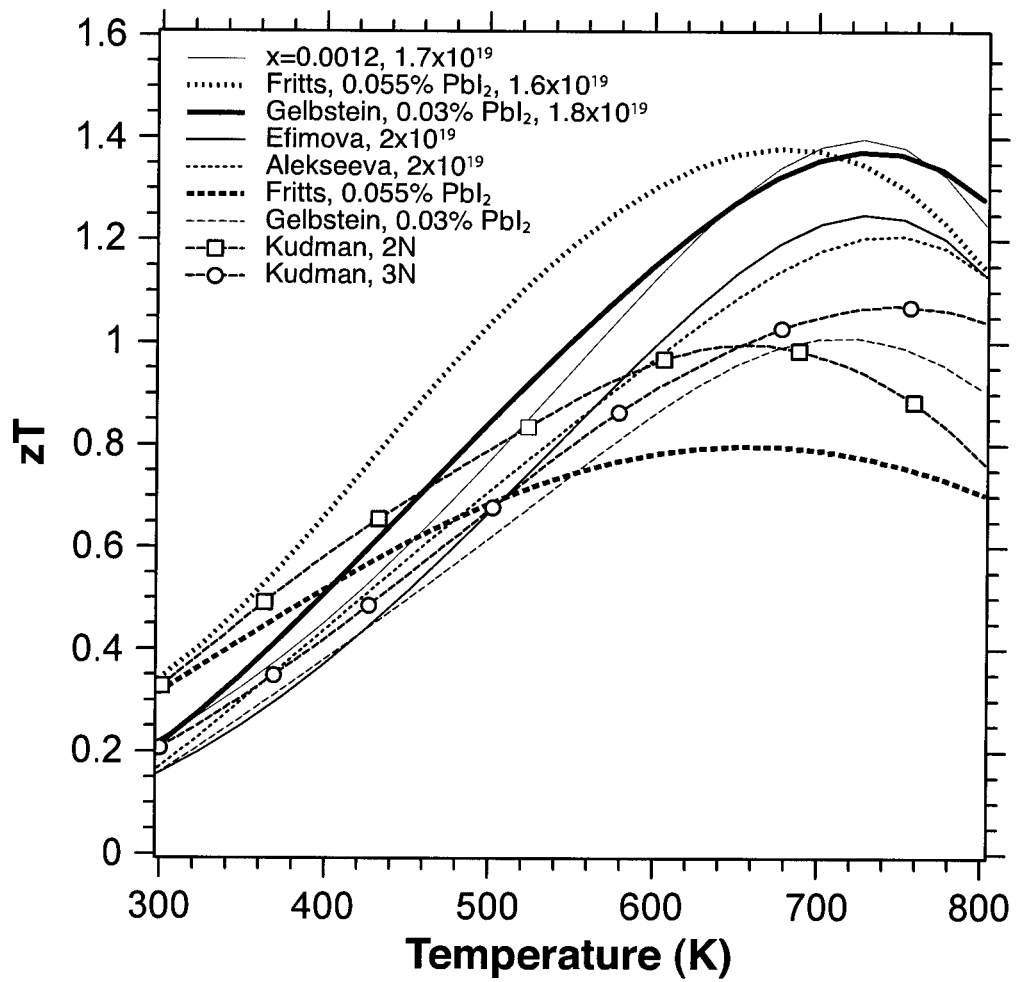

FIG. 14 demonstrates, in accordance with an embodiment of the invention, comparison of reported zT values from literature of similar carrier concentration values. The dashed lines are the original reported values (Ravich et al *Semiconducting lead chalco-genides* 1970; R. Fritts, *Thermoelectric Materials and Devices*, 1960, pp. 143-162; Gelbstein et al, *Proc. 21st Int. Conf. Thermoelectrics*, 2002, 9-12; Stavitskaya et al, *Sov. Phys.-Sol. State*, 1966, 7, 2062-2063; Efimova et al. *Sov. Phys. Semi-cond.*, 1971, 4, 1653-1658; and Alekseeva et al, *Semiconductors*, 1996, 30, 1125-1127). The solid lines are estimated values using the electronic transport properties reported in the literature combined with the thermal conductivity values for the sample x=0.0012 from the current study.

Figure 15:
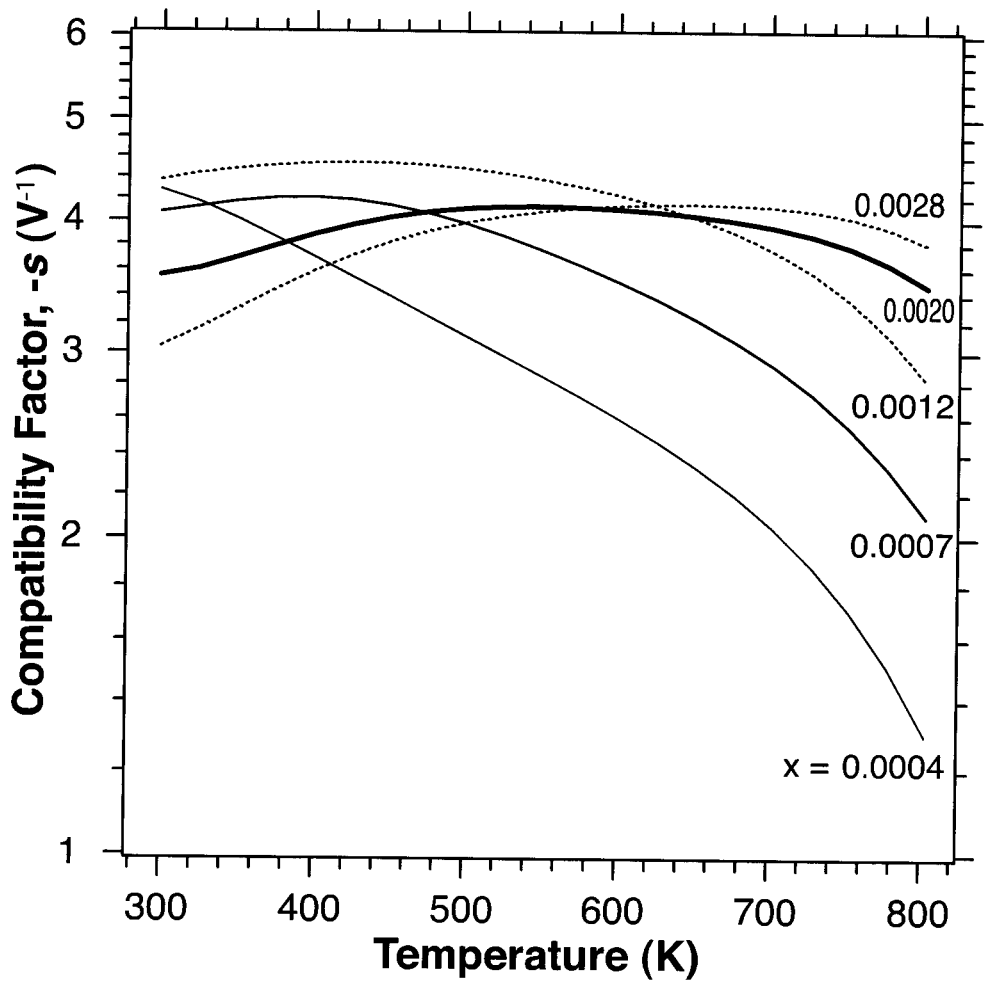

FIG. 15 demonstrates, in accordance with an embodiment of the invention, compatibility factor, s, for $PbTe_{1-x}I_x$.

DESCRIPTION OF THE INVENTION

All references cited herein are incorporated by reference in their entirety as though fully set forth. Unless defined otherwise, technical and scientific terms used herein have the same meaning as commonly understood by one of ordinary skill in the art to which this invention belongs.

As disclosed herein, weak scattering of carriers leads to a high mobility and therefore helps achieve low electric resistivity with a high Seebeck coefficient for a thermoelectric material. The inventors demonstrate this effect by obtaining a thermoelectric figure of merit, zT, higher than 1.3 at high temperatures in n-type PbSe, because of the weak scattering of carriers in the conduction band as compared with that in the valence band. A non-parabolic single Kane band model enables a quantitative explanation of the electrical transport properties and helps identify weak scattering as important to high zT. This work demonstrates weak scattering as a new mechanism for high performance thermoelectrics.

As further disclosed herein, thermoelectric transport properties of n-type $PbTe_{1-x}I_x$ with carrier concentrations ranging from $5.8 \times 10^{18}$-$1.4 \times 10^{20}$ cm$^{-3}$ are reinvestigated from room temperature to 800K. The electronic transport properties, resistivity and Seebeck coefficient in this study are effectively consistent with prior reports, however the thermal conductivity has been found to be historically overestimated. The reassessment of the thermal transport properties, in combination with careful control of the carrier density by iodine doping, reveals a significantly larger figure of merit, zT~1.4, than often previously reported for n-type PbTe. The results and analysis of the data from this study lead to a redetermination of zT for this historical thermoelectric material and provide a renewed interest in n-type PbTe based materials.

In certain embodiments, the invention teaches a thermoelectric material of the formula $Pb_{1.002}Se_{1-x}Br_x$. In some embodiments, $0.04 \leq x \leq 0.4$. In some embodiments, the thermoelectric figure of merit (zT) is greater than 1.2 at 850K. In some embodiments, the doping level is $3 \times 10^{19}$ Cm$^{-3}$. In certain embodiments, $1.8 \times 10^{19}$ Cm$^{-3} \leq n_H \leq 4.5 \times 10^{19}$ Cm$^{-3}$ at about 300K.

In certain embodiments, the invention teaches a method of manufacturing a thermoelectric material, including: providing a quantity of elements, including Pb, Se, and $PbBr_2$; loading the elements into containers; and heating, quenching, annealing, crushing and hot pressing the quantity of elements. In certain embodiments, the elements are loaded into quartz ampoules which are then evacuated and sealed. In some embodiments, the sealed elements are heated up to 1400K. In other embodiments, the sealed elements can be heated at a range from 1200 to 1500 K. In some embodiments, the elements are kept for 12 hours before water quench. In other embodiments, the elements can be kept for between 0.5 to 72 hours. In some embodiments, the elements are annealed at 950K for 72 hours. In some embodiments, the elements are annealed at a temperature ranging from 750K to 1100K for a period of between 1 and 30 days. In certain embodiments, the elements are hot pressed at 873K. In some embodiments, the elements are hot pressed at a temperature range of 723K to 950K under 1 atm argon with 40 MPa pressure for 20 minutes. In some embodiments, the pressure can be from 30 to 80 MPa and the duration can be from between 10 to 120 minutes, followed by another 60 minutes without pressure to annihilate the residue stress within samples. In some embodiments, the thermoelectric material is of a formula $Pb_{1.002}Se_{1-x}Br_x$. In certain embodiments, $0.04 \leq x \leq 0.4$. In some embodiments, the thermoelectric material has a thermoelectric figure of merit (zT)≈1.2 at 850K. In certain embodiments, the thermoelectric material has a doping level of $3 \times 10^{19}$ Cm$^{-3}$. In certain embodiments, $1.8 \times 10^{19}$ Cm$^{-3} \leq n_H \leq 4.5 \times 10^{19}$ Cm$^{-3}$ at about 300K.

In some embodiments, the invention teaches a thermoelectric material of the formula $PbTe_{1-x}I_x$. In certain embodiments, $0.0004 \leq x \leq 0.01$. In certain embodiments, the thermoelectric material has a thermoelectric figure of merit (zT) of 1.4 at 700K-800K. In certain embodiments, the invention teaches the doping level is $5.8 \times 10^{18}$-$1.4 \times 10^{20}$ Cm$^{-3}$.

In certain embodiments, the invention teaches a method of manufacturing a thermoelectric material, including: providing a quantity of elements, comprising Pb, Te, and $PbI_2$; loading the elements into containers; melting and quenching the elements to produce end compounds; and mixing the end compounds having the stoichiometry PbTe and $PbTe_{0.99}I_{0.01}$ to produce a thermoelectric material of the formula $PbTe_{1-x}I_x$. In some embodiments, the elements are melted in vacuum sealed quartz ampoules at 1273K for 6 hours. In some embodiments, the end products are melted at 1273K for 6 hours, water quenched and annealed at 973K for 48 hours. In some embodiments, the resulting ingots are ground into powder and consolidated at 823K for 60 minutes under a pressure of 44 MPa by induction hot pressing. In some embodiments, $0.0004 \leq x \leq 0.01$. In certain embodiments, the thermoelectric material has a thermoelectric figure of merit (zT) of 1.4 at 700K-800K. In certain embodiments, the thermoelectric material has a doping level of $5.8 \times 10^{18}$-$1.4 \times 10^{20}$ Cm$^{-3}$.

In some embodiments, one or more of the inventive thermoelectric materials disclosed herein can be used to facilitate energy recovery when integrated into any of a number of devices suited for that purpose and known to one of skill in the art. Merely by way of example, the thermoelectric materials disclosed herein can be used to recover energy that was let go in the form of waste heat in an automobile or other heat producing mechanical device.

EXAMPLES

Example 1

Experiments I

Polycrystalline PbSe was doped with Br (added in the form of PbBr$_2$) to achieve n type conduction. The Hall carrier density ($n_H$=1/e$R_H$) spans from $7 \times 10^{18}$ to $5 \times 10^{19}$ cm$^{-3}$, the corresponding composition is given by Pb$_{1.002}$Se$_{1-x}$Br$_x$ with x changing from 0.04% to 0.4%. The starting elements (Pb, 99.999%; Se, 99.999%; PbBr$_2$ 99.999%, ultra dry) were weighed out according to each composition and loaded into quartz ampoules, which were then evacuated and sealed. The sealed elements were slowly heated up to 1400K and kept for 12 hours followed by water quench. The ingots obtained were further annealed at 950K for 72 hours before being crushed and ground into fine powders. The powders were then hot pressed at 873K under 1 atm argon with 40 MPa pressure for 20 minutes, followed by another 60 minutes without pressure to annihilate the residue stress within samples (LaLonde et al, Rev Sci Instrum 82 (2), 025104 (2011)). A typical disk shaped sample obtained is 12 mm in diameter, ~1 mm in thickness with density no less than 98% of theoretical density (8.27 g/cm$^3$). Details about property measurements are as described for p type PbSe (Wang et al, Adv. Mater. 23 (11), 1366-1370 (2011)). The heat capacity C$_p$ was determined using the equation C$_p$/k$_B$ atom$^{-1}$=3.07+4.7$\times 10^{-4}$ (T/K-300) based on experimental results and is believed to be accurate for lead chalcogenides (Blachnik et al Z. Naturforsch. (B) B 29 (9-10), 625-629 (1974)). The uncertainty of each measurement is estimated to be ~5% which might add up to ~20% for the zT.

The obtained samples are labeled with their Hall carrier density at 300K for the following discussion. Both Seebeck coefficients and resistivities increase with increasing temperature as for the majority of the samples in this study as plotted in FIGS. 1 a) and b), respectively. This is consistent with a degenerate semiconducting behavior. Together with the slow increase in the measured R$_H$ at high temperatures, most of the samples can be approximately considered as a single band conduction for the entire temperature range studied. The lightest doped sample '7E18' shows an extreme in Seebeck coefficients because of the onset of the bipolar effect (the thermal excitation of minority carriers). However, this doesn't occur until 750K, at this temperature the effective band gap estimation using E$_g$=2eS$_{max}$T$_{max}$ (S$_{max}$, T$_{max}$ being the maximum of Seebeck coefficient and the temperature at which it is achieved) yields a value of 0.38 eV, in good consistence with those obtained in p type PbSe samples.

Figure 2:
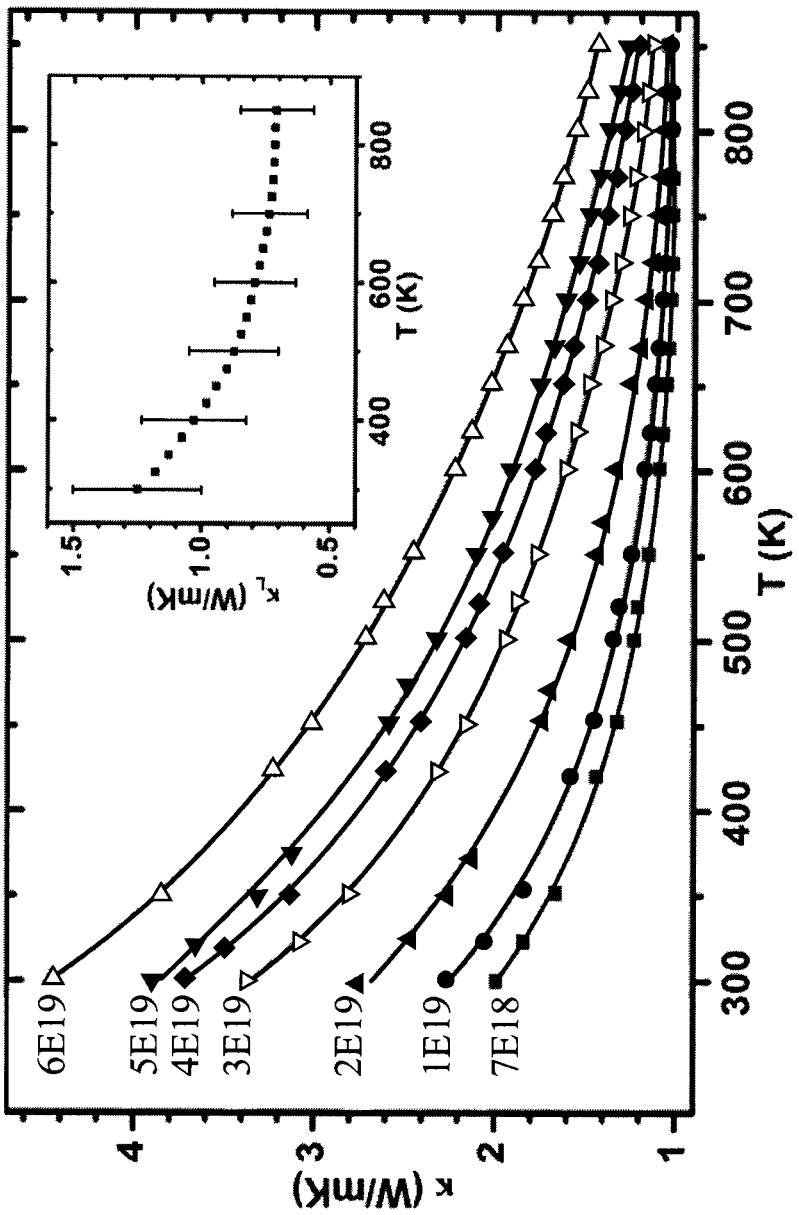
FIG. 2 demonstrates, in accordance with an embodiment of the invention, thermal conductivity and the lattice part (inset) as a function of temperature for Br doped PbSe.

The thermal conductivities (FIG. 2) decrease with temperature. At 850K it is found between 1.4 W/mK to 1.0 W/mK depending on doping levels. The lattice thermal conductivity $\kappa_L$ is calculated by subtracting the electronic contribution $\kappa_e$=LT/$\rho$. The result changes noticeably with doping level. The curve in the inset of FIG. 2 represents an average value from moderately doped samples.

Figure 3:
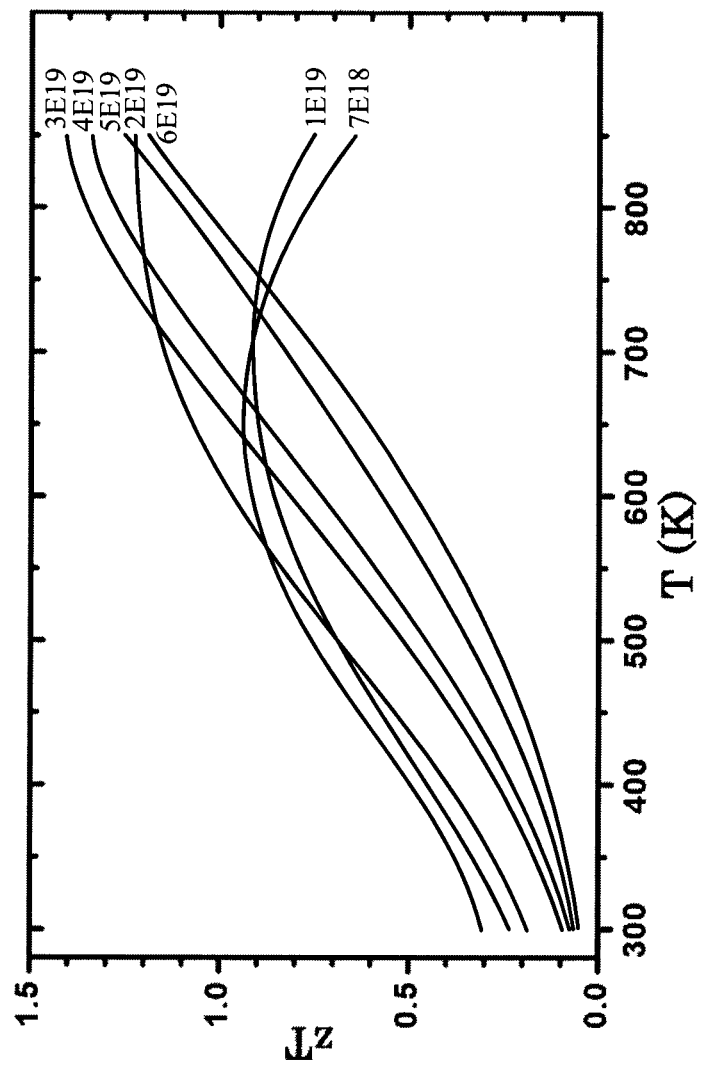
FIG. 3 demonstrates, in accordance with an embodiment of the invention, zT as a function of temperature for Br doped PbSe.

The zT values versus temperature are plotted in FIG. 3. Since each parameter was not obtained at the same temperature the curve fit results from experimental data were used to calculate zT. The optimum doping level is found to be around $3 \times 10^{19}$ cm$^{-3}$ which achieves zT as high as 1.3 at 850K (obtained in multiple samples with room temperature n$_H$ of 3~4$\times 10^{19}$ cm$^{-3}$ and measured along the directions perpendicular and parallel to the hot press direction). zT greater than 1 above 650K was achieved in a wide range of samples with n$_H$ between $1.8 \times 10^{19}$ and $4.5 \times 10^{19}$ cm$^{-3}$ at 300K.

Thermoelectric PbSe forms a single conduction band near the primary band gap with small band mass. This band dominates the transport properties for n-type PbSe, and the band extreme locates at L point of the Brillouin zone having four equivalent ellipsoid pockets (N=4).

For single band conduction and assuming a parabolic band (SPB), the dispersion relation of carriers can be expressed as:

$$\frac{\hbar^2 k^2}{2m^*} = \varepsilon, \quad g(\varepsilon) = \frac{1}{2\pi^2}\left(\frac{2m_d^*}{\hbar}\right)^{3/2} \varepsilon^{1/2}$$

$\hbar$, k, m$_d^*$ and $\varepsilon$ stand for the reduced Plank's constant, the wave vector of electron, the density of states effective mass (m$_d^*$=N$^{2/3}$m$_b^*$, m$_b^*$ being the effective band mass of a single pocket) and the energy of electron state, respectively. By plugging this into the Boltzmann transport equations, one can calculate the electrical transport coefficients of a thermoelectric material. The detailed equations for SPB can be found elsewhere (May et al, Phys. Rev. B 80 (12), 125205 (2009)).

However, as for lead chalcogenides the conduction band (same for the light valence band, LB) has been proved to be non-parabolic, instead, it can be well approximated by the single Kane band (SKB) model. The most fundamental difference between the SKB model and the SPB model is that SKB takes into account the first higher order nonparabolicity term in the dispersion relation so that the carrier density of states is expressed as:

$$\frac{\hbar^2 k^2}{2m^*} = \varepsilon\left(1 + \frac{\varepsilon}{\varepsilon_g}\right), \quad g(\varepsilon) = \frac{2^{1/2} m_d^{*3/2}}{\pi^2 \hbar^3}\left(\varepsilon + \frac{\varepsilon^2}{\varepsilon_g}\right)^{1/2}\left(1 + \frac{2\varepsilon}{\varepsilon_g}\right)$$

For lead chalcogenides having n$_{H,300K}$ of ~10$^{19}$ cm$^{-3}$ or higher, the acoustic phonon scattering of carriers is usually predominant at room temperature and above, so that the relaxation time is given by:

$$\tau \approx \tau_{ac} = \frac{\hbar C_l N}{\pi k_B T \Xi^2} g(\varepsilon)^{-1}\left[1 - \frac{8\beta(z+\beta z^2)}{3(1+2\beta z)^2}\right]$$

In this equation k$_B$ is the Boltzmann constant, C$_l$ ($9.1 \times 10^{10}$ Pa for PbSe) is a constant determined by the combination of the elastic constants, $\Xi$ is a constant related to a combination of acoustic deformation potentials which describes the carrier scattering strength by acoustic phonons, z is the reduced energy z=$\varepsilon$/k$_B$T, $\beta$ is defined by $\beta$=k$_B$T/$\varepsilon_g$, where $\varepsilon_g$ is the gap between conduction and valence band at L point, it changes with temperature via $\varepsilon_g$/eV=0.17+4$\times 10^{-4}$ T/K. The transport parameters are expressed as:

The carrier density:

$$n = \frac{(2m_d^* k_B T)^{3/2}}{3\pi^2 \hbar^3} {}^0L_0^{3/2}$$

The Seebeck coefficient:

$$S = \frac{k_B}{e}\left[\frac{{}^1L_{-2}^1}{{}^0L_{-2}^1} - \eta\right]$$

$\eta$ is the reduced chemical potential $\eta = u/k_B T$.
The mobility:

$$\mu = \frac{2\pi \hbar^4 e C_{lk} N}{m_\chi^* (2m_d^* k_B T)^{3/2} \Xi^2} \frac{{}^3 {}^0 L_{-2}^1}{{}^0L_0^{3/2}}$$

Due to the anisotropy of conduction and valence bands at L point in lead chalcogenides, the conduction effective mass $m_\chi^*$ and the density of states effective mass $m_d^*$ are governed by the effective band mass of a single pocket along two directions:

$$m_\chi^* = 3\left(\frac{2}{m_\perp^*} + \frac{1}{m_\parallel^*}\right)^{-1}, \quad m_d^* = N^{2/3}(m_\perp^{*2} m_\parallel^*)^{1/3}$$

For PbSe $m_d^* = 0.27\, m_e$ at 300K and changes with temperature according to $m_d^* \sim T^{0.5}$ was determined in this study. Further extrapolating this to 77 K yield $m_d^* = 0.13\, m_e$, in good agreement with the value determined by longitudinal Nernst-Ettingshausen effect ($0.12\, m_e$).

The Hall factor A (the carrier concentration is determined via $n = An_H = A/eR_H$):

$$A = \frac{3K(K+2)}{(2K+1)^2} \frac{{}^0L_{-4}^{1/2} L_0^{3/2}}{({}^0L_{-2}^1)^2}$$

$K = m_\parallel^*/m_\perp^*$ ($K=1.75$, assumed T independent), and the Lorenz number:

$$L = \left(\frac{k_B}{e}\right)^2 \left[\frac{{}^2L_{-2}^1}{{}^0L_{-2}^1} - \left(\frac{{}^1L_{-2}^1}{{}^0L_{-2}^1}\right)^2\right]$$

In the equations above the integral ${}^nL_l^m$ is defined by $$^nL_l^m = \int_0^\infty \left(-\frac{\partial f}{\partial z}\right) z^n (z+\beta z^2)^m [(1+2\beta z)^2 + 2]^{1/2} dz$$

Figure 1:
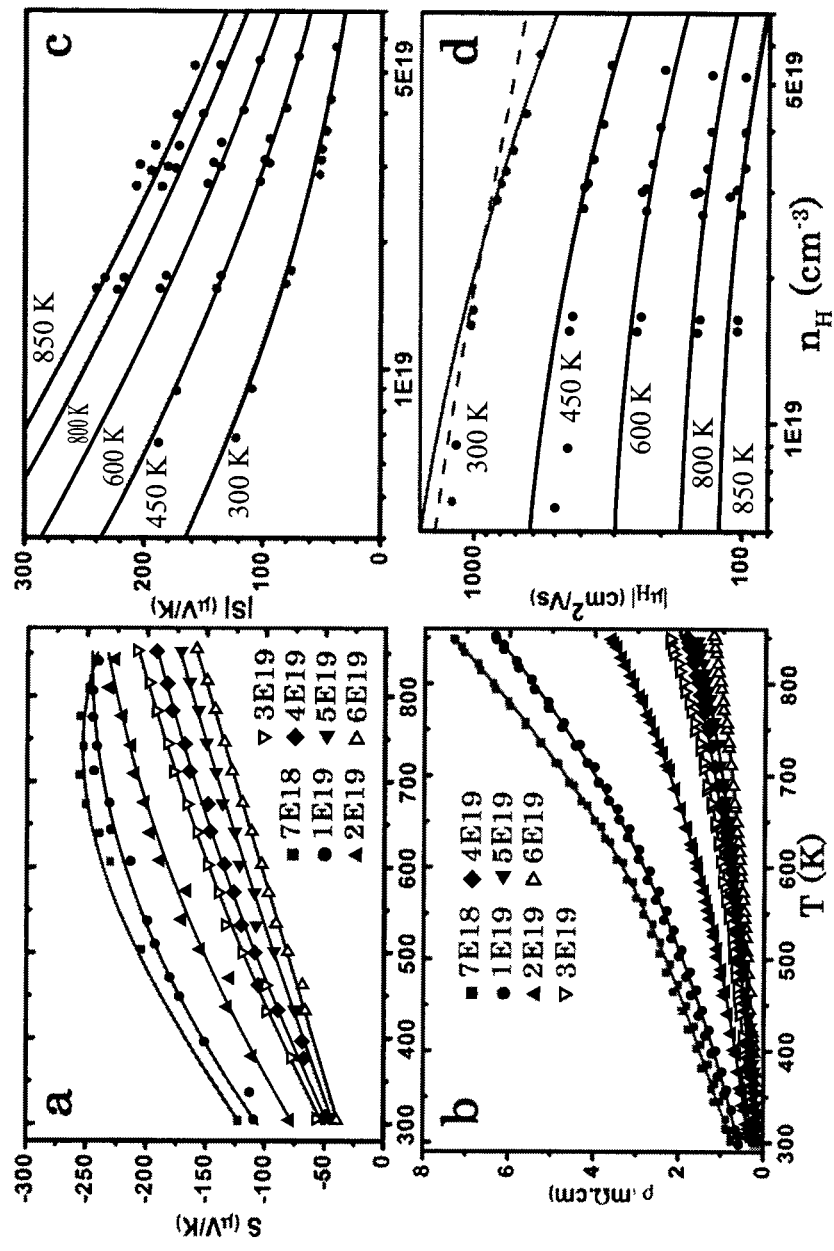
FIG. 1 demonstrates, in accordance with an embodiment of the invention, a) Seebeck coefficient, b) resistivity as a function of temperature for Br doped PbSe. c) Seebeck coefficient, d) Hall mobility against carrier density at different temperatures. The solid curves in c) and d) are calculated from the SKB model, the dashed curve in d) is from SPB model.

FIG. 1 c) shows the Seebeck Pisarenko plot (S plotted against $n_H$) using SKB at different temperatures. Up to 850K the calculated curve explained experimental data well. FIG. 1 b) shows the Hall mobility $\mu_H$ ($\mu_H = R_H/\rho$) vs Hall carrier concentration. At 300K, the SKB model (solid curves) successfully explained experiment results for samples with $n_H$ greater than $1.5 \times 10^{19}$ cm$^{-3}$. The model tends to overestimate mobilities for samples with lower carrier density, which is probably due to other scattering mechanisms, such as polar optical phonon scattering which usually plays an important role in lightly doped lead chalcogenides at low temperatures.

Figure 4:
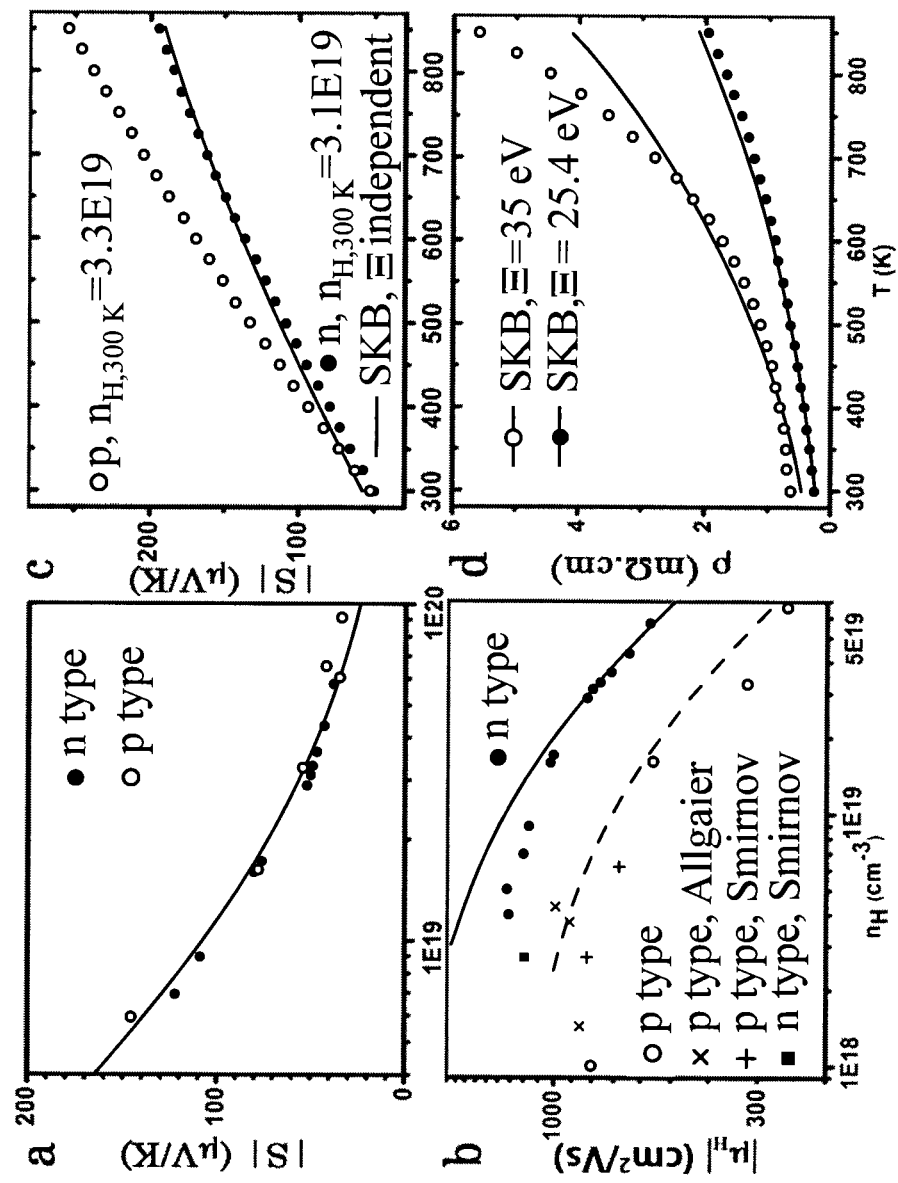
FIG. 4 demonstrates, in accordance with an embodiment of the invention, a) Seebeck coefficient and b) Hall mobility Pisarenko plot at 300K. c) Seebeck coefficient and d) resistivity of two samples with similar carrier density but different signs. All curves are calculated from the SKB model.

It is surprising that being comparable with the high zT obtained in p-type PbSe, where the two converged valence bands produce a high number of valleys, zT>1.3 can be achieved in properly doped n-type PbSe, knowing that its entire electrical properties are contributed by a single band. This implies that there should be some unique feature in the conduction band. FIG. 4a) shows the Seebeck Pisarenko plot at 300K with both n type and p type samples. The consistency of the calculated curve with both groups indicates that $m_d^*$ is the same ($m_d^* = 0.27\, m_e$) for both the conduction band (CB) and the light valence band (LB, located at L point with N=4). Besides, the speed of sound measurement was carried out on polycrystalline samples and confirmed the same value regardless of the type of doping. This means the parameter $C_l$ which is determined by the elastic moduli should be the same for n type and p type materials. FIG. 4b) shows the Hall mobility $\mu_H$ of n type and p type samples at 300 K, the p type samples are selected so that their carrier density is relatively low, thus the influence from the heavy band at this temperature is negligible. Mobility data reported by Smirnov and Allgaier are also included (Smirnov et al Soviet Physics—Solid State 2 (8), 1793-1804 (1961) and Allgaier et al, Physical Review 111 (4), 1029-1037 (1958)). It is clearly seen that the mobility of n-type material is much higher than p-type in the entire carrier concentration range (the same trend has also been found at low temperature). Furthermore, the SKB model provides an excellent prediction on $\mu_H$ vs. $n_H$ for both n- and p-type materials when acoustic phonon scattering is dominant. The only difference is: for n type samples the parameter $\Xi = 25.4$ eV while for p type samples $\Xi = 35$ eV. In other words, carriers are less scattered by acoustic phonons in the conduction band compared with those in the light valence band.

Example 2

To further understand the difference between n type PbSe and p type ones, the temperature dependent Seebeck coefficient and resistivity of each type are compared with the SKB calculation results, as shown in FIG. 4c) and d) respectively. The two samples involved have roughly the same carrier density ($n_{H,300K} \sim 3 \times 10^{19}$ cm$^{-3}$). Using parameters determined above the SKB model successfully predicts both the Seebeck coefficient and the resistivity for n type PbSe up to 850K. This model fails to predict the S and r for p type PbSe especially at high temperatures, due to the two band feature in p type PbSe. Most importantly, it is further seen from FIG. 4d) that p-type PbSe shows much stronger carrier scattering (larger $\Xi$) than n-type at low temperatures, where the light valence band dominates the transport properties (CB and LB has the same $m_\chi^*$, $m_d^*$ and N).

To better see the different origin of high zT in n type and p type PbSe, consider the expression for power factor:

$$S^2 \sigma =$$

$$S^2 ne\mu \sim \left[\frac{{}^1L_{-2}^1}{{}^0L_{-2}^1} - \eta\right]^2 m_d^{*3/2} L_0^{3/2} \frac{N}{m_\chi^* m_d^{*3/2} \Xi^2} \frac{{}^0L_{-2}^1}{{}^0L_0^{3/2}} = \frac{N}{m_\chi^* \Xi^2}\left[\frac{{}^1L_{-2}^1}{{}^0L_{-2}^1} - \eta\right]^2 {}^0L_{-2}^1$$

The z dependent part $$\left(\left[\frac{{}^1L_{-2}^1}{{}^0L_{-2}^1}-\eta\right]^2 {}^0L_{-2}^1\right)$$

can be optimized via carrier density tuning. So the maximum power factor one could achieve for a given system is determined by the band degeneracy N, the conduction effective mass, and the constant $\Xi$. In p type PbSe high zT is achieved due to the convergence of the light and the heavy valence bands, which effectively increased band degeneracy N. In n type PbSe, with the absence of this feature, high zT is achieved because the scattering of carriers in the conduction band is much weaker.

Example 3

To sum up, n type PbSe doped with Br are prepared and their thermoelectric properties from 300-850K are measured. zT values greater than 1.3 are achieved at 850K. A single non-parabolic Kane band model gives an excellent explanation of electric properties throughout the temperature and carrier density range studied. The result indicates that the weaker carrier scattering by acoustic phonons in the conduction band compared with the light valence band is the main reason for such high zT. The capability of achieving high zT in both p type and n type PbSe, due to different mechanisms independent to each other, further extends the interests on this material system for competing with the more expensive thermoelectric PbTe.

Example 4

Experiments II $PbTe_{1-x}I_x$ as a High Performance N-Type Thermoelectric Material Lead chalcogenides have low thermal conductivity and excellent electronic transport properties required for high performance thermoelectric materials. However, historically there are very few well documented thermal conductivity measurements on n-type PbTe, in contrast to the sophisticated measurements of the electronic properties and band structure lead by Soviet Union scientists Much of the early thermal characterization on thermoelectric materials, including PbTe, was done using an absolute steady state method best suited for measurements below room temperature, becoming susceptible to measurement error in the medium to high temperature range. In the 1960's when PbTe materials were extensively investigated as a thermoelectric material it was well known that accurate characterization of thermal conductivity at high temperature was difficult. Early studies, such as the seminal work on PbTe by Fritts, used room temperature thermal conductivity data for zT calculation extrapolated to elevated temperatures (R. Fritts, *Thermoelectric Materials and Devices*, 1960, pp. 143-162). Without a doubt, this method resulted in an overestimated lattice thermal conductivity and therefore an underestimated zT, as it is known that the lattice thermal conductivity should decrease roughly with 1/T due to the Umklapp scattering of phonons at high temperatures. Analogously, it has been recently pointed out that this assumption led to severely underestimated zT values (~0.7) in the p-type Na-doped PbTe where the actual optimal value is ~1.4. The same assumption for thermal conductivity at elevated temperature has led to an equally underestimated zT (~0.8) in n-type $PbI_2$ doped material as well (referred to as $PbTe_{1-x}I_x$ in this report), and it is reported here that the actual zT value is ~1.4 between 700-800 K with the proper doping level.

Historically the n-type PbTe that has been most used by NASA for powering space crafts were referred to as "2N" and "3N" (R Abelson, *Thermoelectrics Handbook: Macro to Nano*, 2006, ch. 56, pp. 1-26). This material was developed by the 3M corporation (Fritts) and the exact details on the processing of these alloys are not known. However, it was known that the n-type material was typically prepared by adding $PbI_2$ to the base PbTe compound, with the 2N composition containing 0.076 wt % $PbI_2$ (~x=0.0010), and 0.14 wt % (~x=0.0020) for the 3N composition (D. Snowden, *Insulator and materials for close-spaced thermoelectric modules*, Hi-z technology, inc. for U.S. department of energy technical report, 2003). The zT values of Fritts' material matched that for 2N and 3N and were therefore assumed to be accurate. The data reported by Fritts has been widely reported to date and is believed to be accurate for $PbI_2$ doped PbTe. This n-type PbTe is contained in the only commercially available (Global Thermoelectric) thermoelectric generators operating above 525K, and is therefore mostly developed for use in waste heat recovery applications.

Although the commonly referenced zT for n-type PbTe is ~0.8, there are various reports in the literature showing zT~1. Kudman has reported the zT values for 2N and 3N material of ~1 using a high temperature thermal diffusivity measurement system (Abeles et al, *J. Appl. Phys.*, 1960, 31, 1585-1592). Gelbstein has reinvestigated iodine doping of PbTe using previously reported thermal conductivity data to obtain zT~1.1 (Gelbstein et al, *Proc. 21st Int. Conf. Thermoelectrics*, 2002, 9-12 and Gelbstein et al, *Physica B*, 2005, 363, 196-205). The total thermal conductivity of nanostructured $Pb_{1-x}Sn_xTe$—PbS doped with 0.055 mol % $PbI_2$ has recently been investigated using flash diffusivity and finds $\kappa$~1 $Wm^{-1}K^{-1}$ near 700K, compared to Fritts' reported values of ~1.9 $Wm^{-1}K^{-1}$ for iodine doped PbTe Similar materials in the PbTe—CdTe system have recently been studied using the flash diffusivity technique as well, reporting total thermal conductivity values $\kappa$~1 $Wm^{-1}K^{-1}$ for the samples with the smallest amount of Cd alloying (1%) (Ahn et al, *J. Am. Chem. Soc.*, 2010, 132, 5227-5235).

The zT values reported in the $Pb_{1-x}Sn_xTe$—PbS system ranged from 1-1.5 at 650K and were just less than 1.2 at 720K in the PbTe CdTe system. The work disclosed herein uses the same technique for thermal conductivity measurement that has commonly been used in the field of thermoelectrics since the 1990's. To date, no existing research combines the optimized carrier concentration from the initial historic research for basic n-type PbTe combined with the flash diffusivity technique for accurate thermal characterization.

The inventors confirm herein the electronic transport properties of S, $\rho$ and n of similar compositions to those reported in the past for n-type PbTe doped with $PbI_2$, as well as additional samples across the doping range as an attempt to more carefully control the carrier density. The high temperature thermal conductivity is measured to 800K enabling a more accurate determination of a peak zT~1.4 from 700-800K, a significant difference from the assumption of a maximum zT of ~0.8.

Example 5

Sample Preparation and Characterization

Polycrystalline samples of $PbTe_{1-x}I_x$ (x=0.0004, 0.0007, 0.0012, 0.0020, 0.0028, 0.0040, 0.0055 and 0.0100) were prepared by appropriately mixing end compounds having the stoichiometry PbTe and PbTe$_{0.99}$I$_{0.01}$. The end compounds were prepared by melting the stoichiometric ratio of elemental Pb, Te and PbI$_2$ in vacuum sealed quartz ampoules at 1273K for ~6 hours followed by water quenching. The PbTe and PbTe$_{0.99}$I$_{0.01}$ were used to prepare the PbTe$_{1-x}$I$_x$ samples which were sealed in quartz ampoules, melted at 1273K for 6 hours, water quenched and annealed at 973K for 48 hours. The annealed ingots were hand ground to powder and were consolidated at 823K for 60 minutes under a pressure of 44 MPa by induction hot pressing (LaLonde et al, *Rev. Sci. Instrum.*, 2011, 82, 025104). The resulting samples are greater than 98% theoretical density. The Seebeck coefficient was calculated from the slope of the thermopower vs. temperature gradient measurements from Chromel-Nb thermocouples, resistivity and Hall coefficient were measured using the Van der Pauw technique under a reversible magnetic field of 2 T, and the thermal diffusivity measurement was made by the laser flash method (Netzsch LFA 457). All measurements were performed under vacuum. Heat capacity (Cp) was estimated by $C_p$ ($k_B$ per atom)$=3.07+4.7\times10^{-4}\times$(T/K$-300$), obtained by fitting experimental data reported by Blachnik within an uncertainty of 2% for all the lead chalcogenides at T>300K giving Cp~10% higher than the Dulong-Petit limit value at T>700K, as previously reported (Blachnik and R. Igel, *Z. Naturforsch. B*, 1974, 29, 625; Pei et al, *Adv. Energy Mater.*, 2011, 1, 291-296; and Pei, et al *Energy Environ. Sci.*, 2011, DOI: 10.1039/c0ee00456a). It should be emphasized that this simple equation agrees well with the theoretical prediction taking the lattice vibration, dilation, the linear coefficient of thermal expansion and charge carrier contributions into account. The combined uncertainty for all measurements involved in zT determination is ~20%. It is important to ensure that the nomenclature used to describe the composition of the materials in different reports is understood so that a meaningful comparison can be made. Based on a comparison of the inventors' transport data to that reported by Fritts, they deduce that Fritts interprets mol % of PbI$_2$ to mean the number of mols of PbI$_2$ (3 atoms/molecule) out of the number of mols of PbTe (2 atoms/molecule). This interpretation gives the number of mols of PbI$_2$ to be ~x/2 in the formula PbTe$_{1-x}$I$_x$ (For example, Fritts' 0.03% PbI$_2$ corresponds to x=0.0006). Based on the table that Gelbstein gives and the transport properties reported, it is consistent that his interpretation of mol % PbI$_2$ is the number of mols of PbI$_2$ molecule relative to the number of mols of each Pb and Te individually (Gelbstein et al *Physica B*, 2005, 363, 196-205). Gelbstein's interpretation gives the number of mols of PbI$_2$ to be ~x/4 in PbTe$_{1-x}$I$_x$ (For example, Gelbstein's 0.03% PbI$_2$ corresponds to x=0.0012). In this report the form PbTe$_{1-x}$I$_x$ is used.

It should be noted that nearly all previous works on n-type PbTe doped with iodine contain an excess of Pb (>50 atomic %) in composition. Excess lead is added in order increase the mechanical strength over that of the stoichiometric material and to help ensure reproducible electrical properties (R. Fritts, *Thermoelectric Materials and Devices*, 1960, pp. 143-162). Having an excess of Pb should lead to Te vacancies and n-type carriers on the order of $3\times10^{17}$-$1.7\times10^{18}$ cm$^{-3}$, while further including additional doping elements will allow carrier concentrations on the order of $10^{20}$ cm$^{-3}$ (R. Fritts, *Thermoelectric Materials and Devices*, 1960, pp. 143-162). As the excess Pb is not necessary to obtain the desired doping levels for PbTe, the material for this study has been made in the stoichiometric composition. By investigating the stoichiometric composition the results are not expected to be attributed to any effects of having excess Pb present, such as the presence of nanometer size precipitates or temperature dependent carrier concentration.

Example 6

Results and Discussion

Figure 5:
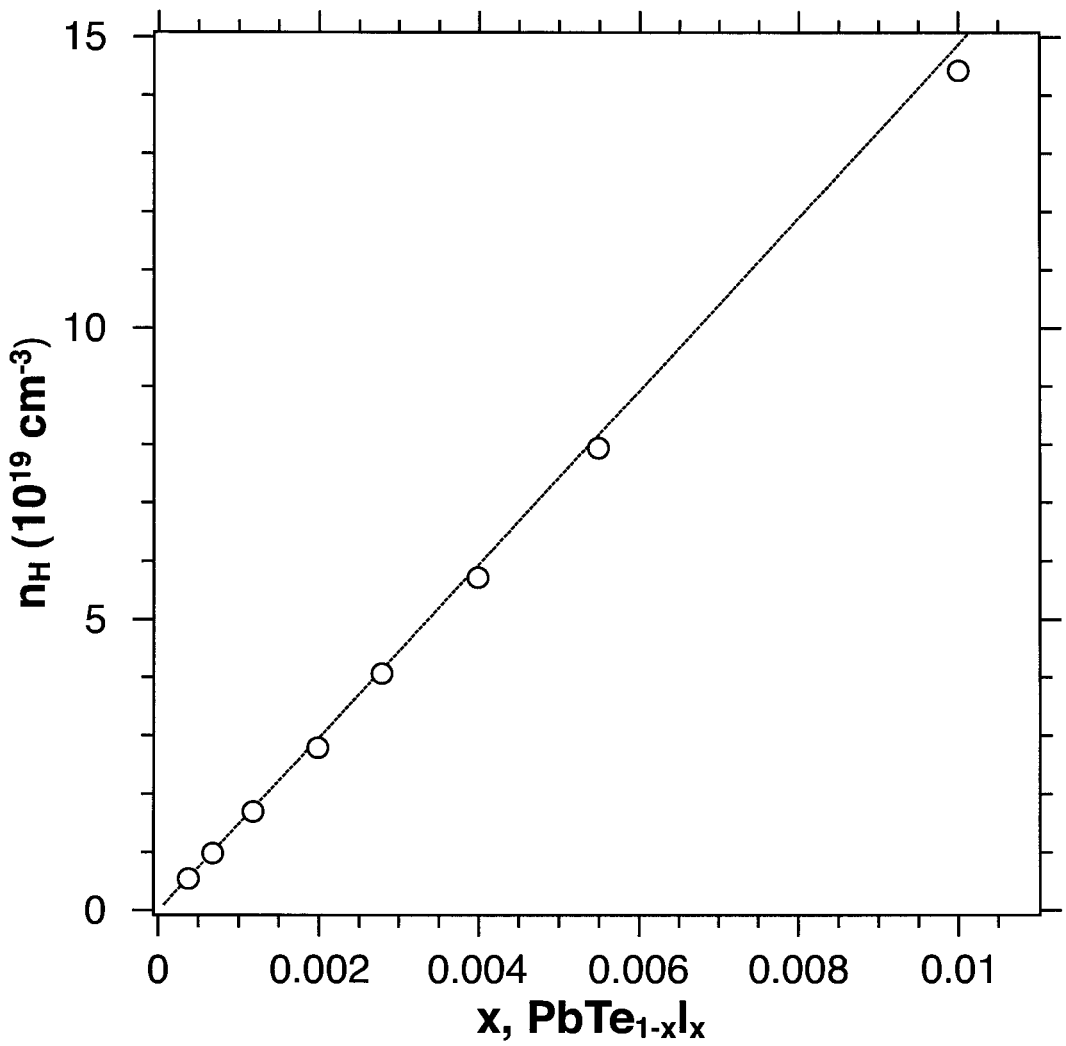
FIG. 5 demonstrates, in accordance with an embodiment of the invention, room temperature Hall carrier concentration for $PbTe_{1-x}I_x$ for the 8 compositions reported in this study. The dashed line is the expected carrier concentration for 1 $e^-$ per I atom.

The measured negative Hall coefficients indicate the n-type conduction for all samples made by the inventors. The calculated Hall carrier concentrations ($n_H=1/eR_H$) are shown and compared in FIG. 5 to the calculated values, assuming each substitutional I atom releases one extra free electron into the conduction band due to the valence rule.

Iodine acts effectively as a 1:1 dopant when substituted for Te and is capable of precisely controlling the carrier concentration in PbTe. Carrier concentrations ranging from $5.8\times10^{18}$-$1.4\times10^{20}$ m$^{-3}$ were obtained. The undoped PbTe made by the inventors had n-type conduction with a carrier concentration of $1.11\times10^{18}$ cm$^{-3}$.

Figure 6:
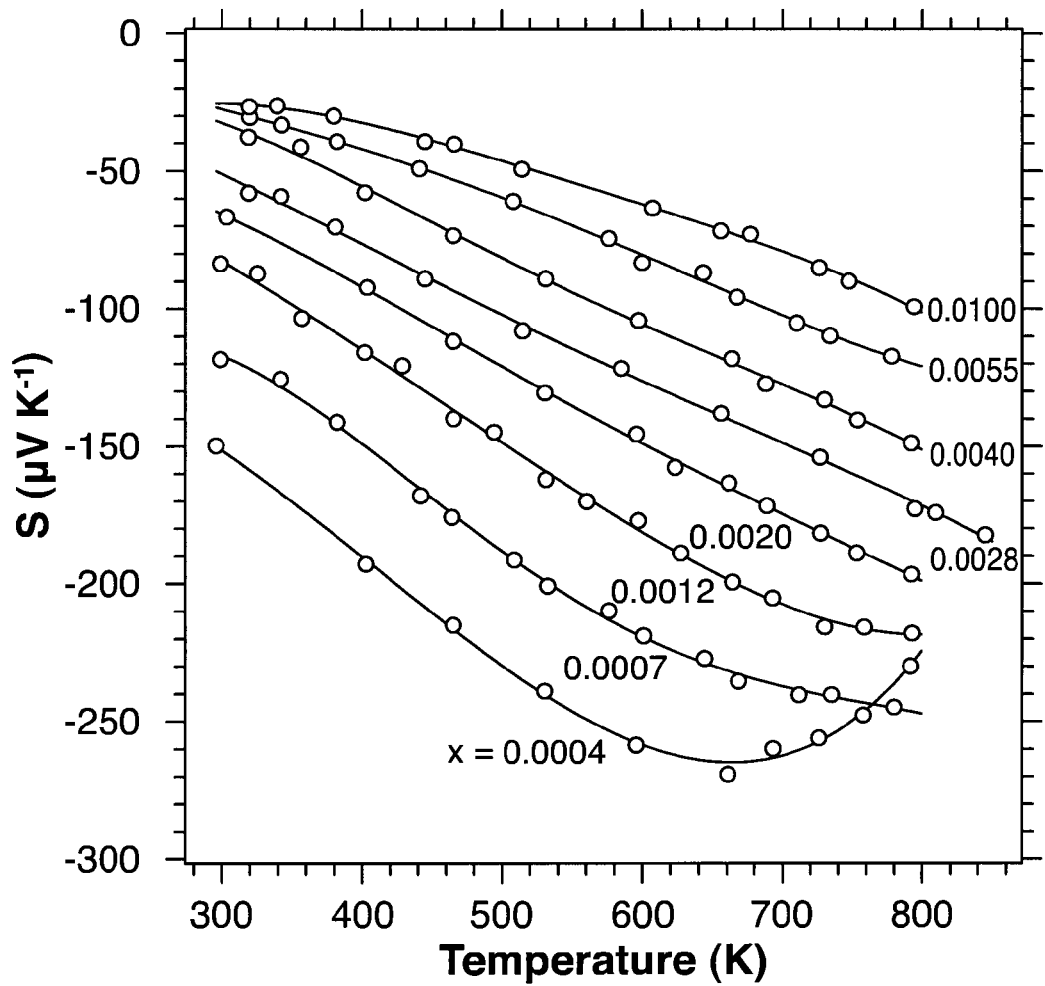
FIG. 6 demonstrates, in accordance with an embodiment of the invention, temperature dependent Seebeck coefficient for $PbTe_{1-x}I_x$.
Figure 7:
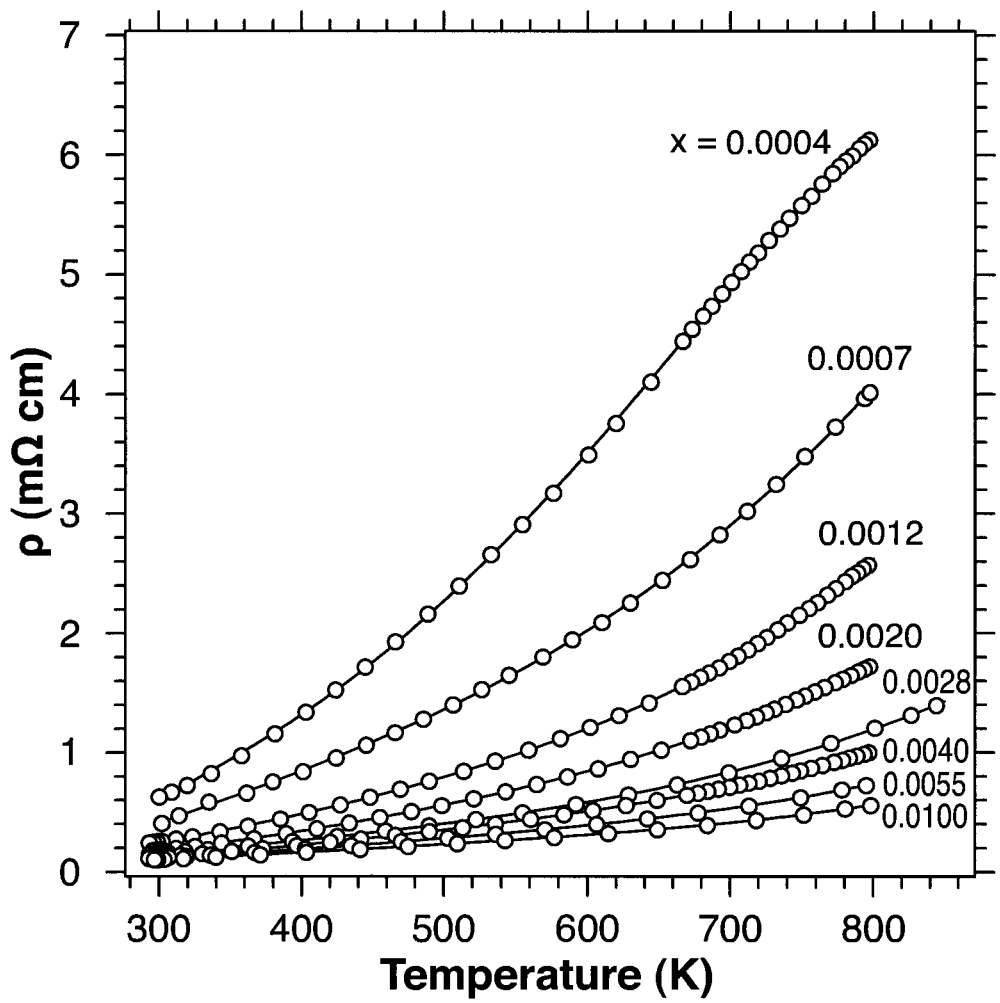
FIG. 7 demonstrates, in accordance with an embodiment of the invention, electrical resistivity as a function of temperature for $PbTe_{1-x}I_x$.

The measured values of the Seebeck coefficient and resistivity up to 800K for the samples described herein are shown in FIGS. 6 and 7. With increasing temperature, the linearly increasing absolute Seebeck coefficient and the monotonically increasing resistivity suggest degenerate semiconducting behavior for the majority of the samples here. These trends, combined with the observation of a slightly increased Hall coefficient as temperature increases (which can be expected from a slight loss of degeneracy as temperature increases) allow the assumption of single band conduction behavior for most of the samples within the carrier concentration and temperature ranges studied.

Figure 8:
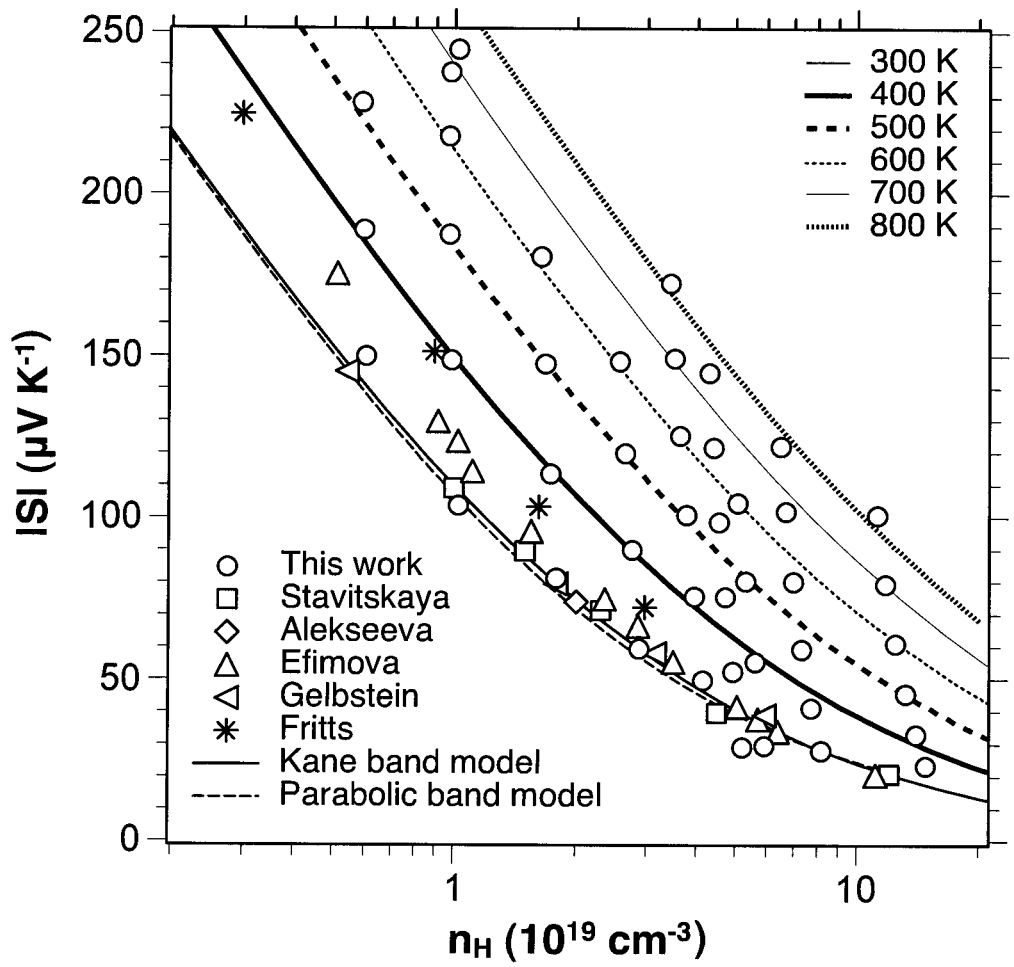
FIG. 8 demonstrates, in accordance with an embodiment of the invention, the carrier concentration dependent Seebeck coefficient for $PbTe_{1-x}I_x$ at several temperatures. Room temperature values from this study are compared to those reported in the literature (R. Fritts, *Thermoelectric Materials and Devices*, 1960, pp. 143-162; Gelbstein et al, *Proc. 21st Int. Conf. Thermoelectrics*, 2002, 9-12; Stavitskaya et al, *Sov. Phys.-Sol. State*, 1966, 7, 2062-2063; Efimova et al. *Sov. Phys. Semi-cond.*, 1971, 4, 1653-1658; and Alekseeva et al, *Semiconductors*, 1996, 30, 1125-1127). Carrier concentration was not reported by Fritts or Gelbstein and was therefore assumed to be the predicted value based on the absolute iodine concentration from the compositions reported.

An effective method that has been widely adopted for PbTe and PbSe to obtain meaningful insight regarding the carrier scattering mechanism and the band structure is to analyze the carrier density dependent Seebeck coefficient (the so-called Pisarenko relationship). The majority of the reported Seebeck coefficient data show a similar carrier density dependence at a given temperature, for both n-type and p-type PbTe. The data disclosed herein for the room temperature Seebeck coefficient vs. carrier density is shown in FIG. 8 along with reported values for comparison. At 300K the values from this study are shown to be in agreement with historically reported values for the same material, indicating no significant change in the electronic transport properties by iodine doping of PbTe. Moreover, the Seebeck coefficient vs. carrier density relationship can be well predicted from a single Kane band model (solid curve) which takes the band non-parabolicity effect into account as carrier concentration and temperature increase. It should be noted that this model assumes carrier scattering dominated by acoustic phonons in the temperature range studied. The model also takes into account the temperature dependent density of states mass at the conduction band edge of d ln m*/d ln T=0.5 and band separation of E/eV(T)=0.18+4T/10000. Additionally, the band anisotropy factor is assumed to be ~3.6 and temperature independent. The details of the single Kane band model can be found elsewhere (Ravich et al, *Semiconducting lead chalco-genides*, Plenum Press, 1970). The Kane band model describes the high temperature S vs. $n_H$ data very well, as shown in FIG. 8.

In addition, the theory of acoustic scattering enables an accurate prediction of the carrier mobility based on a single Kane band model when the deformation potential coefficient ($E_{def}$), which defines the strength of the scattering on carriers by acoustic phonons, is known (Ravich et al, *Semiconducting lead chalco-genides*, Plenum Press, 1970). Using the knowledge that the conduction band minima of PbTe occurs at the L-point of the Brillouin zone with a valley degeneracy of 4, the electronic transport data fit to the Kane band model determines the value of $E_{def}$ to be in the range of 22±2 eV in the extrinsic conduction region. The room temperature mobility vs carrier density is shown in FIG. 9 and compared to literature results.

Figure 9:
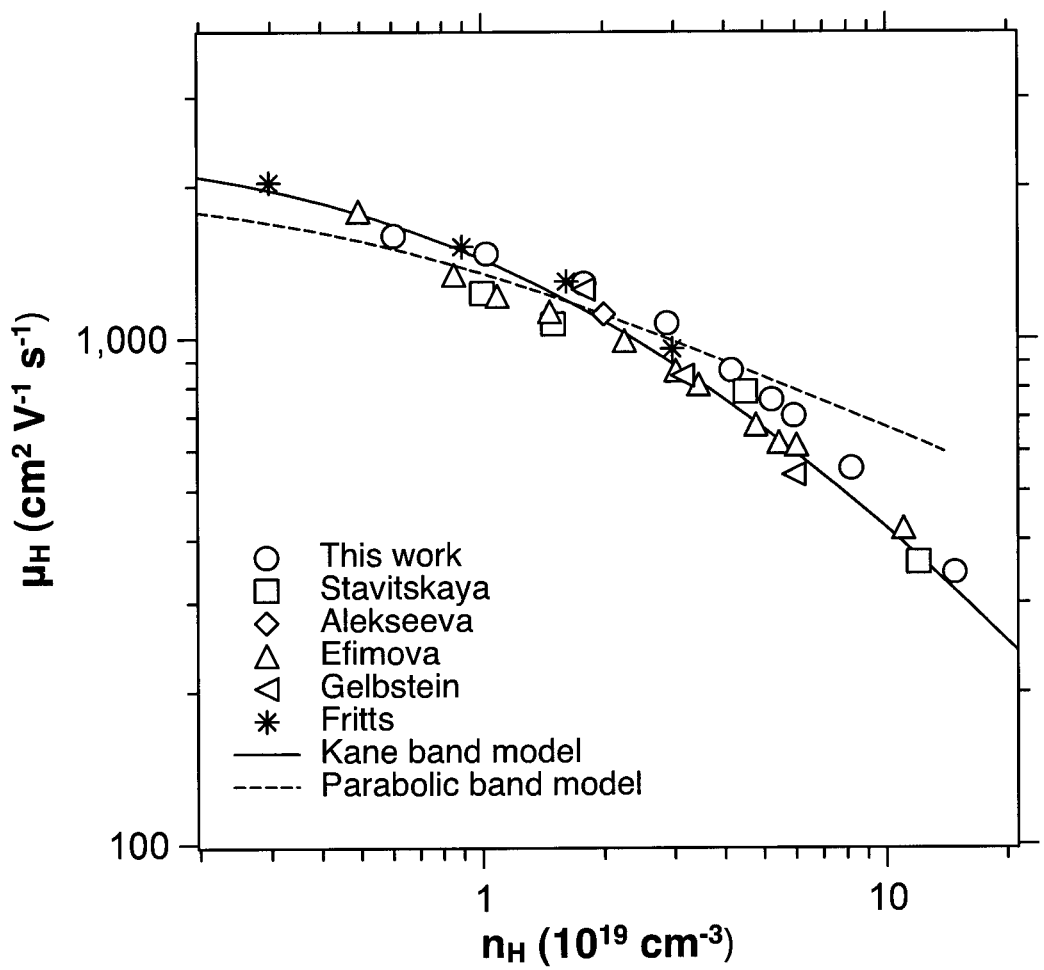
FIG. 9 demonstrates, in accordance with an embodiment of the invention, room temperature carrier concentration dependent Hall mobility for $PbTe_{1-x}I_x$. The values from this study are compared to those reported in the literature (R. Fritts, *Thermoelectric Materials and Devices*, 1960, pp. 143-162; Gelbstein et al, *Proc. 21st Int. Conf. Thermoelectrics*, 2002, 9-12; Stavitskaya et al, *Sov. Phys.-Sol. State*, 1966, 7, 2062-

For comparison, FIGS. 8 and 9 also include the model predictions (dashed curves) of carrier density dependent Seebeck coefficient and mobility at room temperature assuming a single parabolic band (SPB) model, which does not take the band nonparabolicity into account. The details about the SPB model under acoustic scattering can be found elsewhere (Ravich et al, *Semiconducting lead chalco-genides*, Plenum Press, 1970; and C. Bhandari and D. Rowe, *CRC Handbook of Thermoelectrics*, 1995, ch. 5, 43-53). Even though the SPB model enables an equally accurate prediction of the Seebeck coefficient as the SKB model (FIG. 8), using the same m* of 0.25 $m_e$ and the same $E_{def}$ of 22 eV, the carrier density dependent mobility (FIG. 9) can be better explained by the Kane band model, especially at higher doping levels where the band nonparabolicity effect is stronger.

It is clear that both the carrier concentration and temperature dependent electronic transport properties in the present work are consistent with the data reported by Gelbstein and Fritts. Shown in FIG. 10 are selected data from the literature that are commonly cited for n-type PbTe. In the temperature range where maximum zT values are expected (700-750 K) the sample from the current study has a resistivity value ~20% lower than the compared literature reports and a Seebeck coefficient ~10% lower, most likely due to slightly different dopant concentrations. The combined result of these differences minimally affects the power factor ($S^2/\rho$) and result in a difference of ~5% at high temperatures. A significant increase in the value of zT should, therefore, not be attributed to an increase in the power factor for these materials and is entirely due to the difference in thermal conductivity.

The measured total thermal conductivity for all samples is shown in FIG. 11. It has been shown that iodine acts as an effective electron donor (FIG. 5) thereby decreasing the resistivity due to the increased carrier concentration (FIG. 7). This decrease in resistivity results in an increase in the electronic component of the thermal conductivity ($\kappa_E$) and therefore an increase in the total thermal conductivity (FIG. 11), as this term is calculated by the Wiedemann-Franz law ($\kappa_E = LT/\rho$) where L is the Lorenz number.

The highest average zT is achieved in the composition of x=0.0012 disclosed herein and will therefore be the focus of the following discussion on the thermal transport properties.

Among similar iodine doped PbTe one can clearly see the total thermal conductivity measured by the laser flash thermal diffusivity method in the present study shows an ~30-35% lower value than that of the steady state method over the whole temperature range studied. The data estimated by Fritts shows a different trend because a temperature independent lattice thermal conductivity value is assumed. Such a large discrepancy between total thermal conductivity values will lead to a significant difference in the determination of the lattice component of the thermal conductivity in contrast to the electronic transport data which show excellent agreement with previous reports.

An estimation of L and its temperature dependence can be made using the same Kane band model used to describe the electronic transport properties to determine $\kappa_E$ for n-type PbTe materials. The estimation of the lattice component of the thermal conductivity ($\kappa_L$) for the sample x=0.0012 is shown in FIG. 12. The lattice thermal conductivity is determined by subtracting the electronic component from the total thermal conductivity, $\kappa_L = \kappa - \kappa_E$. The estimated lattice thermal conductivity value at room temperature is ~1.5 $Wm^{-1}K^{-1}$ and ~0.75 $Wm^{-1}K^{-1}$ at 750 K. These values are in close agreement with recently reported $\kappa_L$ values for p-type PbTe materials measured using the same laser flash method, also shown in FIG. 12. In each of these n- and p-type PbTe cases the materials are heavily doped.

In the study reported by Fritts the temperature independent lattice thermal conductivity of 1.4 $Wm^{-1}K^{-1}$ (0.055% $PbI_2$, ~x=0.0012) and non-degenerate L (1.5×10$^{-8}$ $W\Omega K^{-2}$) was used and resulted in an overestimation of the total thermal conductivity, shown in FIG. 12 (R. Fritts, *Thermoelectric Materials and Devices*, 1960, pp. 143-162). This overestimation in κ, needless to say, leads to significantly underestimated values of zT, particularly at high temperatures.

In the study reported by Gelbstein, showing a peak zT~1.1, κ was not measured Gelbstein et al, *Proc. 21st Int. Conf. Thermoelectrics*, 2002, 9-12. The electronic component of the thermal conductivity was calculated from measured resistivity data, the Wiedemann-Franz law (L~2.44×10$^{-8}$ $W\Omega K^{-2}$), and subsequently combined with the calculated lattice component. The lattice component in Gelbstein's study was calculated using an expression derived from published data obtained from the steady state method below 400K (Ravich et al, *Semiconducting lead chalco-genides*, Plenum Press, 1970). This method of thermal conductivity measurement is known to be sensitive at high temperature evident in FIG. 12. This point of vulnerability in the material characterization is also present in a considerable amount of older research reports (Stavitskaya et al, *Sov. Phys.-Sol. State*, 1966, 7, 2062-2063; Efimova et al, *Sov. Phys. Semi-cond.*, 1971, 4, 1653-1658; and Alekseeva et al, *Semiconductors*, 1996, 30, 1125-1127).

The zT values for samples made by the inventors are shown in FIG. 13. As the doping concentration increases, the peak zT increases, as well as the temperature of the peak. A peak zT of 1.4 is observed at about 750K for samples with x=0.0012-0.0020. The sample x=0.0028 was re-measured to 850K and shows zT slightly greater than 1.4 at T>800K.

Shown in FIG. 14, the zT values for the sample x=0.0012 are compared to zT values reported in literature for samples of similar carrier concentration and composition. Also shown in FIG. 14 are the zT values from the literature that have been recalculated using the originally reported S and $\rho$ values in combination with the L values for $\kappa_E$ and lattice thermal conductivity from the current study for the sample x=0.0012. Both the original (dashed lines) and the recalculated (solid lines) results are shown. It can be seen that the recalculation results in peak zT values differing by ~25-35% (same level of thermal conductivity variation). It can also be seen that the 2N data reported by Kudman (FIG. 14) shows excellent agreement with the inventors x=0.0004 sample (FIG. 13) in the entire temperature range, suggesting the historical 2N material is probably under-doped. By further increasing the carrier density, both the peak and average zT can be realized as shown in FIG. 13. The samples being compared are close in carrier concentration and composition and show recalculated peak zT~1.2-1.4 at high temperatures, a significant difference from the value of zT~0.8 that is generally believed.

An additional 10 gram sample of the x=0.0012 composition was prepared and consolidated into a cylinder ~10 mm tall. One sample was cut across the top of the cylinder and another sample along the length of the cylinder. The resistivity of these two samples was measured to 850K and show a difference of <5%, which is within the uncertainty of the resistivity measurement, eliminating possible contributions from anisotropy effects induced by the uniaxial hot pressing technique. It is also noted that the sample x=0.0012 has been made on 3 different occasions from separate alloy ingots and show minimal (<5%) variation in properties. One of the additional batches of material was made as the composition reported by Gelbstein's 0.03% $PbI_2$ (x~0.0012) which contains excess Pb and the measured properties were not affected by the non-stoichiometry of the material (Gelbstein et al, *Proc. 20th Int. Conf. Thermo-electrics*, 2001, 143-149). X-ray diffraction was done in an effort to confirm the phase purity of the samples and no evidence was found that would suggest the presence of any secondary phases. Additionally, it has been previously reported that there is no significant difference between single crystal and polycrystalline samples of n-type PbTe (Efimova et al, *Sov. Phys. Semi-cond.*, 1971, 4, 1653-1658).

The precisely and uniformly changing properties make iodine doped PbTe ideal for functionally grading thermoelectric material. FIG. 15 shows the power generation compatibility factor $(s=(\sqrt{(1+zT)}-1)/(ST))$ of the highest performing (zT) $PbTe_{1-x}I_x$ samples which is needed for optimal selection of materials for segmentation and functionally grading. To achieve maximum efficiency in a segmented element, materials with similar compatibility factors (differing by less than a factor of 2) are required. It can be seen that the n-type $PbTe_{1-x}I_x$ materials disclosed herein are highly compatible across the temperature range of application for PbTe based material. These materials are also very compatible with $Bi_2Te_3$ for functionally grading at lower temperatures and are indeed better than previously thought for PbTe and $Bi_2Te_3$. Using optimally doped $PbTe_{1-x}I_x$ will result in increased thermoelectric efficiency of segmented elements and couples.

In summary, n-type PbTe samples doped with iodine were prepared and the measured electronic transport properties were shown to be agreeable with historically reported data for this material system. The common practice flash thermal diffusivity technique was used for measurements to 800K and results in significantly lower thermal conductivity values than older measurement methods. The combination of precise control of the doping level and reliable thermal conductivity measurements reveals a large figure of merit of 1.4 between 700-850 K, which is substantially larger than commonly referenced for this historical material. Such a high zT within this temperature range is inherent to PbTe and likely contributes to high zT values measured using the same techniques on similar material systems.

The various methods and techniques described above provide a number of ways to carry out the application. Of course, it is to be understood that not necessarily all objectives or advantages described can be achieved in accordance with any particular embodiment described herein. Thus, for example, those skilled in the art will recognize that the methods can be performed in a manner that achieves or optimizes one advantage or group of advantages as taught herein without necessarily achieving other objectives or advantages as taught or suggested herein. A variety of alternatives are mentioned herein. It is to be understood that some preferred embodiments specifically include one, another, or several features, while others specifically exclude one, another, or several features, while still others mitigate a particular feature by inclusion of one, another, or several advantageous features.

Furthermore, the skilled artisan will recognize the applicability of various features from different embodiments. Similarly, the various elements, features and steps discussed above, as well as other known equivalents for each such element, feature or step, can be employed in various combinations by one of ordinary skill in this art to perform methods in accordance with the principles described herein. Among the various elements, features, and steps some will be specifically included and others specifically excluded in diverse embodiments.

Although the application has been disclosed in the context of certain embodiments and examples, it will be understood by those skilled in the art that the embodiments of the application extend beyond the specifically disclosed embodiments to other alternative embodiments and/or uses and modifications and equivalents thereof.

In some embodiments, the terms "a" and "an" and "the" and similar references used in the context of describing a particular embodiment of the application (especially in the context of certain of the following claims) can be construed to cover both the singular and the plural. The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (for example, "such as") provided with respect to certain embodiments herein is intended merely to better illuminate the application and does not pose a limitation on the scope of the application otherwise claimed. No language in the specification should be construed as indicating any non-claimed element essential to the practice of the application.

Preferred embodiments of this application are described herein, including the best mode known to the inventors for carrying out the application. Variations on those preferred embodiments will become apparent to those of ordinary skill in the art upon reading the foregoing description. It is contemplated that skilled artisans can employ such variations as appropriate, and the application can be practiced otherwise than specifically described herein. Accordingly, many embodiments of this application include all modifications and equivalents of the subject matter recited in the claims appended hereto as permitted by applicable law. Moreover, any combination of the above-described elements in all possible variations thereof is encompassed by the application unless otherwise indicated herein or otherwise clearly contradicted by context.

All patents, patent applications, publications of patent applications, and other material, such as articles, books, specifications, publications, documents, things, and/or the like, referenced herein are hereby incorporated herein by this reference in their entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that can be employed can be within the scope of the application. Thus, by way of example, but not of limitation, alternative configurations of the embodiments of the application can be utilized in accordance with the teachings herein. Accordingly, embodiments of the present application are not limited to that precisely as shown and described.

What is claimed is:

1. A thermoelectric material of the formula $Pb_{1.002}Se_{1-x}Br_x$, wherein $0.04 \leq x \leq 0.4$.

2. The thermoelectric material of claim 1, wherein the thermoelectric figure of merit (zT) is greater than 1.2 at 850K.

3. The thermoelectric material of claim 1, wherein the doping level is $3 \times 10^{19}$ $Cm^{-3}$.

4. The thermoelectric material of claim 1, wherein $1.8 \times 10^{19}$ $Cm^{-3} \leq n_H \leq 4.5 \times 10^{19}$ $Cm^{-3}$ at about 300K.

* * * * *